(12) United States Patent  
Lee

(10) Patent No.: US 7,541,775 B2  
(45) Date of Patent: Jun. 2, 2009

(54) ENHANCED-ACCURACY BATTERY CAPACITY PREDICTION USING MULTIPLE DISCHARGE CURVES

(75) Inventor: Jung Hwan Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 311 days.

(21) Appl. No.: 11/564,387

(22) Filed: Nov. 29, 2006

(65) Prior Publication Data

US 2008/0007221 A1   Jan. 10, 2008

(30) Foreign Application Priority Data

Jun. 28, 2006  (KR) .................... 10-2006-0058764

(51) Int. Cl.
  *H01M 10/44*  (2006.01)
  *H01M 10/46*  (2006.01)
(52) U.S. Cl. ..................................... 320/132
(58) Field of Classification Search ............ 320/107, 320/127, 130, 131, 132, 135, 149; 324/426, 324/427, 430, 433
See application file for complete search history.

(56) References Cited

U.S. PATENT DOCUMENTS 6,087,808 A   7/2000  Pritchard
6,529,840 B1  3/2003  Hing
2004/0160224 A1  8/2004  Yamazaki

FOREIGN PATENT DOCUMENTS

EP       0 583 906 A1   7/1993

OTHER PUBLICATIONS

European Communication dated Aug. 4, 2008 for Application No. 07100291.9, 1 page.

*Primary Examiner*—Edward Tso
(74) *Attorney, Agent, or Firm*—Fish & Richardson P.C.

(57) ABSTRACT

Enhanced-accuracy battery capacity prediction in which a residual capacity of a battery associated with a mobile electronic device are determined and displayed. One or more characteristic values of the battery are detected and an appropriate battery discharge curve is selected from multiple stored battery discharge curves based on the electrical current supply rate or a number of historical charge/discharge cycles of the battery, or both. A detected battery voltage is compared to the selected curve, and the residual capacity of the battery is calculated based on the present discharge capacity and the useful discharge capacity of the battery based on the selected curve. The residual capacity accurately reflects the present operational state of the device and the present state of the battery. The accurate residual capacity of the battery is displayed on a display device for user viewing.

21 Claims, 5 Drawing Sheets

ENHANCED-ACCURACY BATTERY CAPACITY PREDICTION USING MULTIPLE DISCHARGE CURVES

CROSS-REFERENCE TO RELATED APPLICATION

This application claims priority to Korean Patent Application No. 10-2006-0058764, filed on Jun. 28, 2006, which is incorporated herein by reference.

BACKGROUND

1. Field

This document relates to battery capacity prediction, and one particular implementation relates to detecting and displaying a residual capacity of a battery based on characteristic values such as a battery voltage, an electrical current supplied by the battery, and a number of historical charging cycles of the battery.

2. Description of the Related Art

Mobile electronic devices typically use a battery power supply that requires periodic recharging. For example, a mobile electronic device may have an input terminal to which an alternating current-to-direct current (AC/DC) power adaptor can be connected in order to charge the battery, as well as to temporarily supply power to the device during use at a fixed location. However, the mobile electronic device generally depends on the rechargeable battery for power, because the device is transported and used in different locations. The rechargeable battery typically has a limited capacity, and the effective operational duration of a single charge/discharge cycle can vary according to the usage and power consumption characteristics of the mobile electronic device, the overall life of the battery, and the historical usage of the battery.

As a result, during each charge/discharge cycle the mobile electronic device will eventually become inoperable if the battery is permitted to discharge to a level at which the battery power output no longer is sufficient to support operation of the device. In order to provide useful information and advanced warning of impending device inoperability to a device user as the battery power is diminished, the remaining effective operational time, or residual capacity of the battery, can be predicted at any given time or continuously during a charge/discharge cycle of the battery.

SUMMARY

According to one general implementation, battery discharge curves which are based at least in part on a discharge characteristic of a battery are stored, a voltage is measured across the battery, and a characteristic value of the battery is detected. The characteristic value is either an electrical current supplied by the battery or a number of charge/discharge cycles. In addition, one of the battery discharge curves is selected based at least in part on the detected characteristic value, a residual battery capacity is calculated based at least in part on the selected battery discharge curve and the measured voltage, and the residual battery capacity is displayed.

According to another general implementation, battery discharge curves which are based at least in part on a discharge characteristic of a battery are stored, a voltage is detected across the battery, an electrical current supplied by the battery is detected, and a number of charge/discharge cycles is detected. In addition, a first one of the battery discharge curves is selected based at least in part on the electrical current supplied by the battery and a second curve is selected based at least in part on the number of charge/discharge cycles. A combined curve is then generated based at least in part on the first and second curves, a residual battery capacity is determined based at least in part on the measured voltage and the combined curve, and the residual battery capacity is displayed.

According to another general implementation, a voltage is measured across a battery, a curve is selected from a set of battery discharge curves, and a residual battery capacity is determined based at least in part on the measured voltage and the selected curve.

Implementations may include one or more of the following features. For example, a first characteristic value of the battery may be detected and the selection of the curve may be based at least in part on the first characteristic value. Each of the battery discharge curves may be associated with a range of characteristic values. A first digital data signal may be generated based on the measured voltage and a second digital data signal may be generated based on the first characteristic value. The first characteristic value may include an electrical current supplied by the battery or a number of charge/discharge cycles, for example. Detecting the characteristic value may include receiving a digital data signal indicative of the number of charge/discharge cycles from a memory associated with the battery, receiving a user input indicative of the number of charge/discharge cycles, or estimating the number of charge/discharge cycles. The estimate may be based at least in part on a manufacturing date of the battery.

Estimating the number of cycles may include measuring an initial voltage across the battery at a first time, monitoring an output of the battery between the first time and a second time, measuring a final voltage across the battery at the second time, mapping the initial voltage, the output, and the final voltage to a matching curve from the set of battery discharge curves, and establishing the number of charge/discharge cycles based at least in part on the matching curve. Similarly, a second characteristic value of the battery (e.g., an electrical current supplied by the battery) may be detected, and the selection of the curve may be further based at least in part on the second characteristic value. The selection of the curve may further include accessing a two-dimensional table indexed by the first characteristic value and the second characteristic value. The battery discharge curves, which may be stored in a memory, may be predetermined based at least in part on a discharge characteristic of the battery. The memory may be associated with the battery, and the battery discharge curves may be downloaded from a data server. The residual battery capacity may be displayed.

According to another general implementation, a voltage is measured across the battery, an electrical current supplied by the battery is measured, and a number of charge/discharge cycles of the battery is received. In addition, a first curve is selected from a set of battery discharge curves based at least in part on the measured electrical current, a second curve is selected from the set of battery discharge curves based at least in part on the received number, and a combined curve is generated based at least in part on the first and second curves. Furthermore, a residual battery capacity is determined based at least in part on the measured voltage and the combined curve.

Implementations may include one or more of the following features. For example, generating the combined curve may further include subtracting a differential curve based on the second curve from the first curve.

According to another general implementation, a device includes a battery and a memory configured to store a set of battery discharge curves based at least in part on a discharge characteristic of the battery. The device also includes a battery characteristic value detector configured to measure a voltage across the battery and a characteristic value of the battery that may be an electrical current supplied by the battery and/or a number of charge/discharge cycles, and a battery discharge curve selector configured to select a curve from the set of battery discharge curves based at least in part on the measured characteristic value. In addition, the device includes a controller configured to determine a residual battery capacity based at least in part on the measured voltage and the selected curve, and a display configured to display the residual battery capacity.

According to another general implementation, a device includes a battery and a memory configured to store a set of battery discharge curves based at least in part on a discharge characteristic of the battery. The device also includes a battery characteristic value detector configured to measure a voltage across the battery, an electrical current supplied by the battery, and a number of charge/discharge cycles. In addition, the device includes a battery discharge curve selector configured to select a first curve from the set of battery discharge curves based at least in part on the electrical current supplied by the battery, and to select a second curve based at least in part on the number of charge/discharge cycles. Furthermore, the device includes a controller configured to generate a combined curve based at least in part on the first and second curves, and to determine a residual battery capacity based at least in part on the measured voltage and the combined curve. The device also includes a display configured to display the residual battery capacity.

According to another general implementation, a device includes a battery, a battery characteristic value detector configured to measure a voltage across the battery, a battery discharge curve selector configured to select a curve from a set of battery discharge curves, and a controller configured to determine a residual battery capacity based at least in part on the measured voltage and the selected curve.

Implementations may include one or more of the following features. For example, the battery characteristic value detector may be further configured to measure an electrical current supplied by the battery, and the battery discharge curve selector may be further configured to select the curve based at least in part on the measured electrical current. The battery discharge curve selector may further include a reader configured to receive a number of charge/discharge cycles of the battery, and may be configured to select the curve based at least in part on the number of charge/discharge cycles. The device may further include an estimator configured to estimate a number of charge/discharge cycles of the battery, and the battery discharge curve selector may further be configured to select the curve based at least in part on the estimated number of charge/discharge cycles.

According to another general implementation, a device includes a battery and a battery characteristic value detector configured to measure a voltage across the battery and an electrical current supplied by the battery. A battery discharge curve selector is configured to receive a number of charge/discharge cycles of the battery, and to select a first curve from a set of battery discharge curves based at least in part on the measured electrical current and a second curve from the set of battery discharge curves based at least in part on the received number. The device also includes a controller configured to generate a combined curve based at least in part on the first and second curves, and to determine a residual battery capacity based at least in part on the measured voltage and the combined battery discharge curve.

The details of one or more implementations are set forth in the accompanying drawings and the description below. Other features will be apparent from the description and drawings, and from the claims.

DETAILED DESCRIPTION

Figure 1:
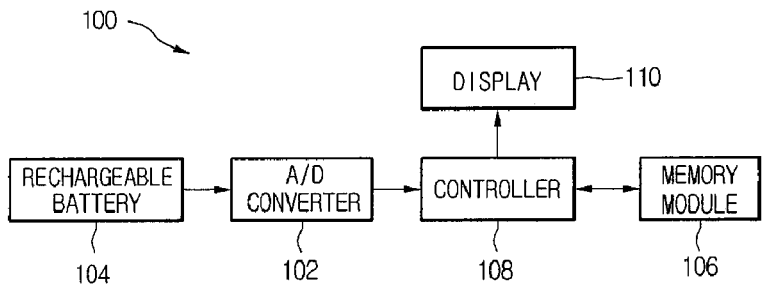
FIGS. 1 to 3 are block diagrams of systems for determining a residual capacity of a battery.

FIG. 1 illustrates one example of an apparatus 100 for determining a residual capacity of a battery. The apparatus 100 includes an analog-to-digital (A/D) converter 102 that converts a voltage supplied by a rechargeable battery 104 into a digital voltage value signal, and a memory module 106 that stores battery discharge curves corresponding to discharge characteristic values of the battery 104. The apparatus 100 also includes a controller 108 that determines the residual capacity of the battery 104 by comparing the voltage value signal from the A/D converter 102 to the discharge curves stored in the memory module 106 and a display unit 110 that displays the determined residual capacity for viewing by a user.

In operation, when a mobile electronic device using the apparatus 100 is activated, the device initiates operation of the controller 108. The battery 104 supplies power for the system operation, and the A/D converter 102 converts a voltage value measured across the battery 104 into a digital signal that is sent to the controller 108. The controller 108 compares the voltage value signal from the A/D converter 102 to battery discharge curves stored in the memory module 106 to determine the residual capacity of the battery corresponding to the measured voltage value. The controller 108 then sends the determined residual capacity of the battery 104 to the display unit 110, which displays the determined residual capacity for viewing by the device user.

Thus, the apparatus 100 for displaying the residual capacity of the battery notifies the user of the remaining battery capacity using a single battery discharge curve. However, the mobile electronic device consumes power at varying rates depending on its usage or state. Therefore, even though a battery with given capacity is used for the device, the effective operational duration of a single charge/discharge cycle can vary according to the usage and power consumption characteristics of the mobile electronic device, the overall life of the battery and the historical usage of the battery.

For example, battery duration decreases in inverse proportion to the number of charge/discharge cycles with repeated use of the battery. In addition, the output of the battery decreases more sharply as the battery residual capacity nears exhaustion during a given charge/discharge cycle. As a result, when the residual capacity of the battery is determined using a single, fixed discharge curve that must represent both a new battery and a used battery, the residual capacity of the battery cannot always be accurately determined in accordance with the usage or state of the mobile electronic device and the rechargeable battery.

Thus, the result of the battery capacity calculation excludes the effects of the overall life of the battery, which sometimes results in display of an inaccurate residual capacity to the user. Consequently, when the remaining capacity of a rechargeable battery implemented by a mobile electronic device becomes exhausted, the mobile electronic device can abruptly and unexpectedly become inoperative because of power shortage.

In a particular implementation, an enhanced-accuracy battery capacity prediction apparatus uses multiple battery discharge curves that take into account the rate of electrical current supplied by the battery during operation, the number of historical charge/discharge cycles the battery has undergone, or both. In this manner, the remaining effective operational time, or residual capacity, of the battery can be more accurately predicted at any given time or continuously during a charge/discharge cycle of the battery to provide more useful information and more accurate advanced warning of impending device inoperability to a device user as the battery power is diminished and eventually becomes exhausted.

Figure 2:
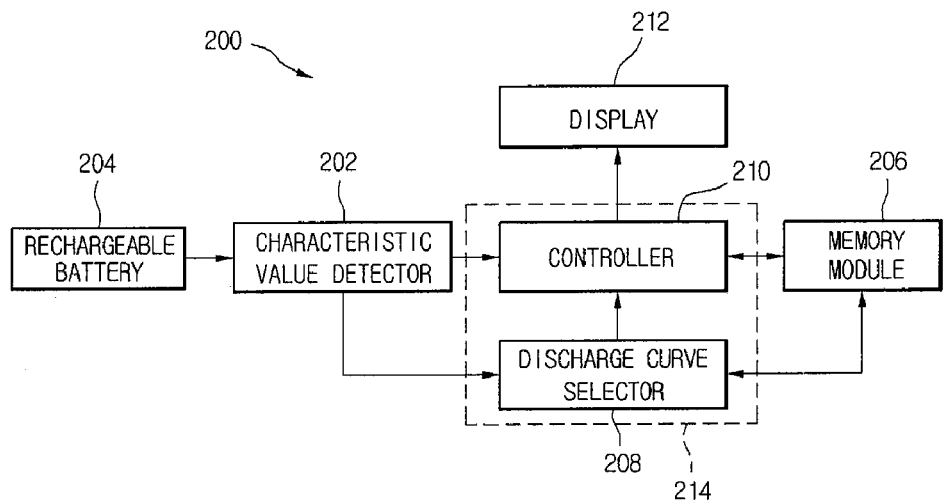

FIG. 2 illustrates an example of a general enhanced-accuracy battery capacity prediction apparatus 200 for detecting and displaying a residual capacity of a battery. The apparatus 200 includes a characteristic value detector 202 that detects one or more characteristic values of a rechargeable battery 204 mounted in or associated with a mobile electronic device, a memory module 206 that stores data corresponding to multiple discharge curves representing discharge characteristics of the battery 204, and a discharge curve selector 208 that selects one or more of the discharge curves. The apparatus 200 also includes a controller 210 that determines a residual capacity of the battery by comparing a characteristic value detected by the characteristic value detector 202 to at least one of the discharge curves, and a display device 212 that displays the residual capacity of the battery determined by the controller 210 to a user.

The characteristic values can include, for example, electrical values associated with the battery, such as a voltage measured across the battery 204 or an electrical current supplied by the battery 204 to operate the mobile electronic device. The characteristic values can also include, for example, other operational values associated with the battery, such as the number of historical charge/discharge cycles of the battery 204.

The characteristic value detector 202 detects a characteristic value of the battery 204 when the mobile electronic device performs a predetermined function. The characteristic value detector 202 also converts the detected characteristic value into a digital data format that can be processed by the controller 210. For example, in one implementation the characteristic value detector 202 may include an A/D converter that converts an electrical current value supplied by the battery 204 into a digital signal. Another implementation may include another A/D converter that converts a voltage measured across the battery 204 into a digital signal.

Alternatively, the controller 210 reads or receives a characteristic value directly from the battery 204, from the memory module 206, or from another data source. For example, the number of recharges, or charge/discharge cycles, of the battery may be used as a characteristic value representing the present status of the battery. Thus, if the battery includes a memory device capable of storing predetermined information, the battery may store information regarding the number of charge/discharge cycles of the battery that can be read by the controller 210.

The memory module 206 stores data corresponding to multiple discharge curves representing battery discharge characteristics. In one implementation, the memory module 206 includes nonvolatile memory, such as flash memory, that is capable of storing discharge curves even when power is disrupted, as well as random access memory (RAM) to temporarily store the discharge curves during the calculation process of the controller 210. The discharge curves include data representative of various discharge characteristics of the rechargeable battery 204. For example, the discharge curves can map battery voltage, measured in volts (V), to battery discharge capacity, measured in milliampere-hours (mAh).

In addition, the discharge curves stored in the memory module 206 may represent multiple curves corresponding to various discharge rates, or rates of electric current supplied by the battery (which may be measured, for example, in milliamperes (mA)), so as to take into account the present usage or status of the mobile electronic device. Furthermore, the discharge curves may represent multiple curves corresponding to varying numbers of charge/discharge cycles of the battery to take into account an overall life or a present performance status of the battery 204, whose performance may be lowered over time. Moreover, the discharge curves may represent multiple curves corresponding to a combination of varying discharge rates and varying numbers of charge/discharge cycles to take into account both the present usage or status of the mobile electronic device and the lowered performance of the rechargeable battery 204.

The discharge curve selector 208 selects one or more of the discharge curves that corresponds to the detected discharge rate (C rate) or number of charge/discharge cycles. The controller 210 determines the residual capacity of the battery by comparing the battery voltage detected by the characteristic value detector 202 with at least one of the selected discharge curves. In some implementations, the discharge curve selector 208 and the controller 210 may be separate modules executed by a central processing unit 214. The controller 210 may further control additional operations of the mobile electronic device.

The display 212 displays the residual capacity of the battery determined by the controller 210. In various implementations, the display 212 may include a cathode ray tube (CRT) monitor, a liquid crystal display (LCD), a plasma display panel (PDP), or any other suitable display.

In operation, when system power of the mobile electronic device is activated, the device initiates operation under control of the central processing unit 214 or controller 210, for example, in response to a user input command. The battery 204 supplies power for operation of the device, and the characteristic value detector 202 detects a characteristic value of the battery 204, and supplies the detected characteristic value to the controller 210 as a digital data signal.

The controller 210 compares the digital characteristic value output to at least one of the multiple battery discharge curves stored in the memory module 206 in order to determine the residual capacity of the battery corresponding to the detected characteristic value. Once the residual capacity of the battery has been determined, the controller 210 communicates the residual capacity to the display unit 212 for display for viewing by a user.

Figure 3:
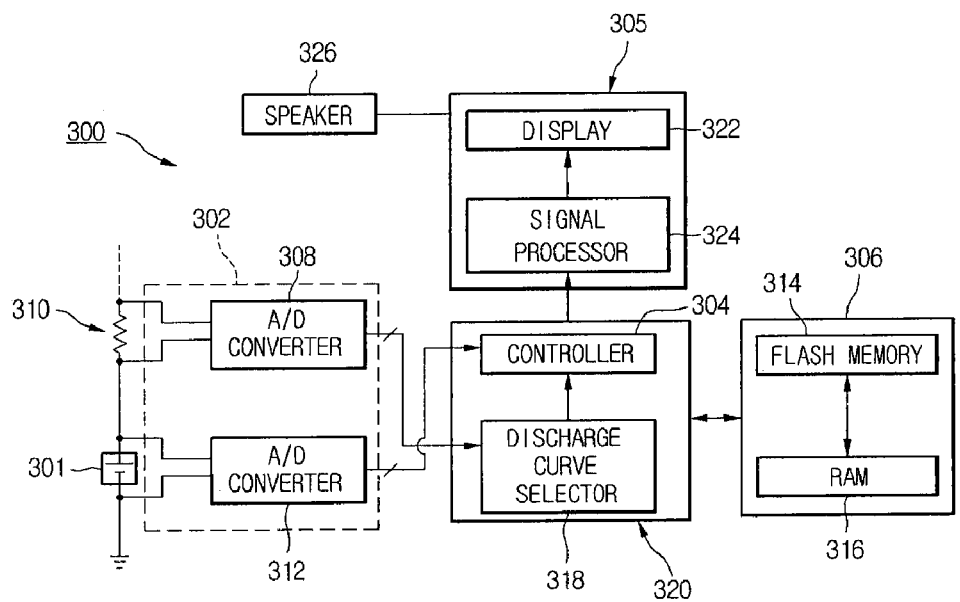

FIG. 3 illustrates an exemplary enhanced-accuracy battery capacity prediction apparatus 300 in which multiple discharge curves that vary with respect to the discharge rate (C rate) or electrical current supplied by a rechargeable battery 301 mounted in a mobile electronic device are used to determine a residual capacity of the battery. The apparatus 300 includes a characteristic value detector 302 that detects characteristic values of the battery 301, a memory module 306 that stores multiple discharge curves that correspond to various predetermined electrical current supply rates of the battery 301, a controller 304 that determines the residual capacity of the battery, and a display unit 305 that displays the determined residual capacity.

The characteristic value detector 302 includes an A/D converter 308 that detects an electrical current output from the battery 301 and converts the detected current value into a digital data signal. For example, the A/D converter 308 may detect the value of the current supplied by the battery by measuring the voltage across a resistor 310 connected in series with the battery 301. Thus, the output from the A/D converter 308 provides information regarding the discharge rate of the battery 301.

In addition, the characteristic value detector 302 includes an A/D converter 312 that detects a voltage value measured across the terminals of the battery 301 and converts the detected voltage value into a digital data signal. In another implementation the characteristic value detector 302 includes a single A/D converter that serially detects both the electrical current output from the battery 301 and the voltage across the battery 301. Both the voltage measured across the battery 301 and the discharge rate of the battery 301 may be used to determine the residual capacity of the battery.

The memory module 306 includes a flash memory 314 that stores the discharge curve data even when power is not supplied to the memory module 306, and a RAM 316 that temporarily stores the discharge curve data for quick access by the controller 304 during the determination of the battery residual capacity. However, the discharge curves may also be stored in a memory module configured as an electrically erasable and programmable read-only memory (EEPROM) or a predetermined area of a hard disk instead of the flash memory 314.

Figure 4:
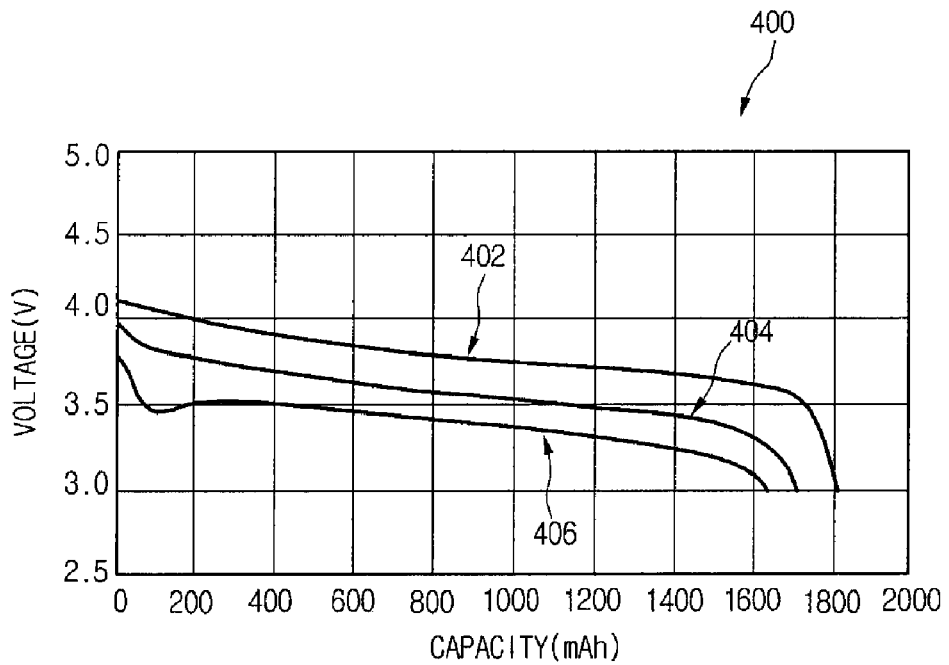
FIG. 4 is a graph of an exemplary set of discharge curves.

The memory module 306 stores discharge curve data representing multiple discharge curves that vary with respect to various predetermined discharge rates of the battery 301 corresponding to various operational states of the mobile electronic device. FIG. 4 is a chart 400 illustrating an exemplary set of discharge curves. The curves represent the discharge characteristics of the battery 301 at various predetermined discharge rates. For example, the first curve 402 may represent the battery discharge characteristics with a continuous battery output of 340 milliamperes (mA), the second curve 404 may represent the battery discharge characteristics with a continuous battery output of 1,700 mA, and the third curve 406 may represent the battery discharge characteristics with a continuous battery output of 3,400 mA.

The discharge curves map battery supply voltage to discharge capacity, that is, the quantity of energy discharged by the battery 301 at a continuous current from a fully-charged state to the measured voltage level. In some implementations, the discharge curves are empirically derived from experimental results obtained from tests performed on the particular type of battery at various discharge rates, for example, by the battery manufacturer. Consequently, when the battery discharge rate, or electrical current, and the battery voltage are measured during operation of the mobile electronic device in a known state, an accurate residual capacity of the battery can be determined using a discharge curve that corresponds to the actual discharge rate.

The discharge curves illustrated in FIG. 4 are based on the assumption that the battery 301 can supply a current of 1,700 mA at four volts when fully-charged, and can supply a continuous current of 1,700 mA for one hour before reaching a minimum acceptable output level of three volts. The curves represent the fact that the effective maximum power supply capacity for a particular battery varies with the aspect or level of power supplied by the battery to the electronic device, that is, the battery discharge rate. Thus, the effective operational duration of a single charge/discharge cycle is greater than one hour at a lower discharge rate, and less than one hour at a higher discharge rate. Of course, various implementations may implement two or more discharge curves representing any suitable discharge rates, and the measured voltage and battery discharge capacity can be represented in any suitable units.

The controller 304 determines the residual capacity of the battery 301 using the output of the characteristic value detector 302 and at least one of the discharge curves stored in the memory module 306. To this end, the apparatus 300 includes a discharge curve selector 318 that receives output from the A/D converter 308 and selects an appropriate discharge curve from the multiple discharge curves in accordance with the electrical current measured by the A/D converter 308. The discharge curve selector 318 may select the discharge curve corresponding to a current rate nearest that measured by the A/D converter 308.

The controller 304 determines the residual capacity of the battery using the selected discharge curve and the measured battery voltage output by the other A/D converter 312. The controller 304 may calculate the difference between the discharge capacity corresponding to the minimum acceptable voltage and the discharge capacity corresponding to the measured battery voltage based on the selected curve. In other implementations, the discharge curve selector 318 and the controller 304 may be separate modules executed by a central processing unit 320.

The display unit 305 then displays the determined residual capacity or a percentage residual capacity, for example, for viewing by a user. In order to display the determined residual capacity in a visual format understandable by the user, the display unit 305 includes a display 322 that employs a CRT monitor, an LCD, a PDP, or the like, that can display predetermined information in a human-recognizable format. In addition, the display unit 305 includes a signal processor 324 that converts the residual capacity output data from the controller 304 into a signal format that is compatible with the display device 322. Furthermore, the apparatus 300 may optionally include a speaker 326, or other audio device, to produce sound to audibly notify the user that the battery output level is nearing depletion.

Figure 5:
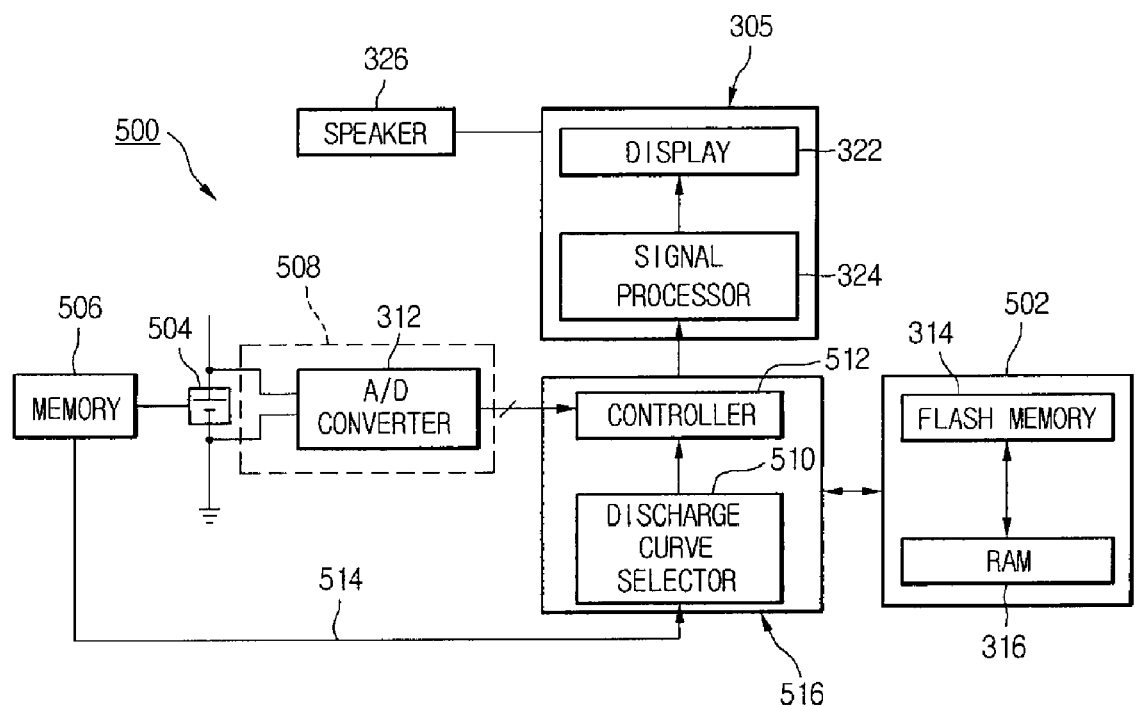
FIG. 5 is a block diagram of another enhanced-accuracy battery capacity prediction system.

FIG. 5 illustrates another exemplary enhanced-accuracy battery capacity prediction apparatus 500 in which multiple discharge curves that vary with respect to a number of charge/discharge cycles of the battery are used to determine a residual capacity of the battery. The apparatus 500 includes a memory module 502 that stores multiple discharge curves that correspond to various numbers of charge/discharge cycles of a battery 504, where the battery 504 includes an associated memory 506. The apparatus 500 also includes a characteristic value detector 508 that detects a characteristic value of the battery 504, a discharge curve selector 510 that selects an appropriate discharge curve, a controller 512 that determines the residual capacity of the battery 504, and a display unit 305 that displays the determined residual capacity.

As described in further detail above, the memory module 502 includes a flash memory 314 and a RAM 316. The memory module 502 stores discharge curve data representing multiple discharge curves that vary with respect to various numbers of historical charge/discharge cycles of the battery 504.

Figure 6:
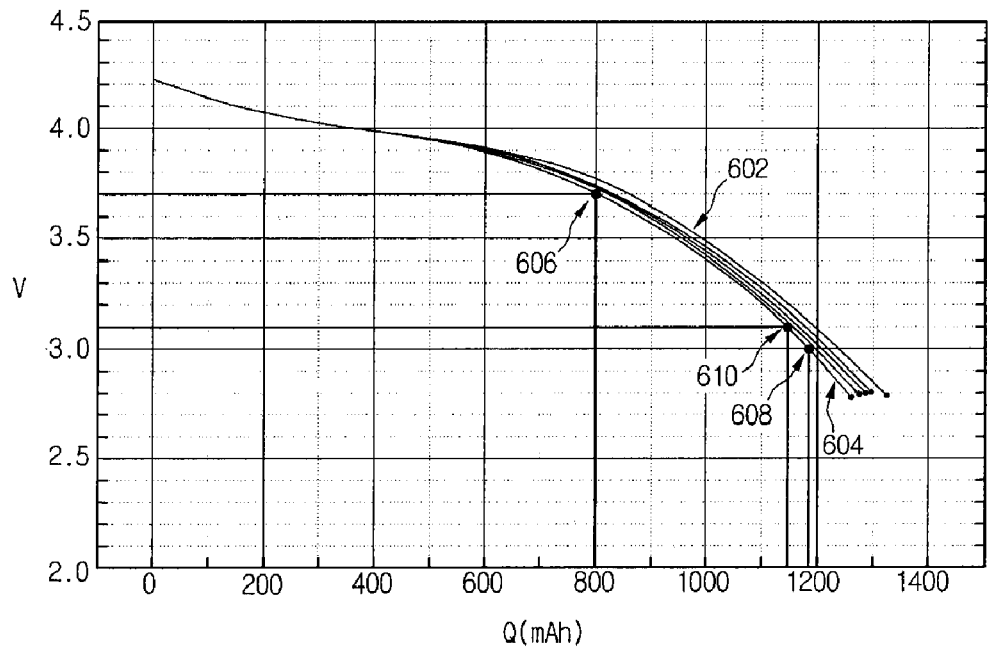
FIG. 6 is a graph of an exemplary set of discharge curves.

FIG. 6 is a chart 600 illustrating a representative set of discharge curves, where the curves represent the discharge characteristics of the battery 504 at various numbers of charge/discharge cycles throughout the overall life of the battery 504. For example, a particular implementation may include five curves 602 that correspond to 100, 200, 300, 400 and 500 charge/discharge cycles.

The discharge curves map battery supply voltage to discharge capacity, that is, the quantity of energy discharged by the battery 504 having a particular number of charge/discharge cycles from a fully-charged state to the measured voltage level. In some implementations, the discharge curves are empirically derived from experimental results obtained from tests performed, for example, by the battery manufacturer on the particular type of battery at various stages of the overall life of the battery as measured by the number of charge/discharge cycles. Consequently, when the number of battery cycles is known and the battery voltage is measured during operation of the mobile electronic device, an accurate residual capacity of the battery can be determined using a discharge curve that corresponds to the stage of the overall battery life.

The curves illustrated in FIG. 6 are based on the assumption that the battery 504 can supply a continuous current of approximately 1,330 mA for one hour beginning at four volts when fully-charged before reaching a minimum acceptable output level of three volts. The curves represent the fact that the effective maximum power supply capacity for a particular battery varies with the historical number of charge/discharge cycles of the battery. That is, the battery capacity decreases in proportion to the number of cycles. Thus, the effective operational duration of a single charge/discharge cycle is less than one hour and decreases with the number of previous charge/discharge cycles. Moreover, the remaining capacity drops off sharply as the battery nears depletion. Of course, various implementations may implement two or more discharge curves representing any suitable numbers of cycles, and the measured voltage and battery discharge capacity can be represented in any suitable units.

In general, the discharge curves depend on the battery type. For example, the battery discharge characteristics and patterns of battery performance reduction vary according to the particular battery design, chemical elements or compounds, and contents of each battery model from each manufacturer. For these reasons, empirical discharge curves verified by the battery manufacturer may be used.

The battery 504 provides digital data representing the number of charge/discharge cycles of the battery 504 to the discharge curve selector 510, or the discharge curve selector 510 reads the number of battery cycles from the memory 506 associated with the battery 504 by way of a communication link 514. That is, the memory 506 associated with the battery 504 stores the number of times the battery 504 has been discharged and recharged to date. For this purpose, the battery 504 may include a counter that increments when the battery 504 reaches a predetermined low voltage level during discharge or when the battery 504 reaches a predetermined full voltage level during charging or recharging, or when a discharge time or a charge/recharge time exceeds a predetermined period.

Based on the number of cycles, the discharge curve selector 510 selects an appropriate discharge curve from the multiple discharge curves in accordance with the battery cycles or a present status of the battery. For example, the discharge curve selector 510 may select the discharge curve corresponding to a number of cycles nearest that provided by the battery 504 or the associated memory 506.

The characteristic value detector 508 includes an A/D converter 312 that detects a voltage value measured across the terminals of the battery 504 and converts the detected voltage value into a digital data signal. The controller 512 determines the residual capacity of the battery using the selected discharge curve and the measured battery voltage output by the A/D converter 312. For example, in one implementation the controller 512 may calculate the difference between the discharge capacity corresponding to the minimum acceptable voltage and the discharge capacity corresponding to the measured battery voltage based on the selected curve. In some implementations, the discharge curve selector 510 and the controller 512 may comprise separate modules executed by a central processing unit 516.

The display unit 305 then displays the determined residual capacity or a percentage residual capacity. As described above, the display unit 305 includes a display device 322 and a signal processor 324. Furthermore, the apparatus 300 may optionally include a speaker 326.

Figure 7:
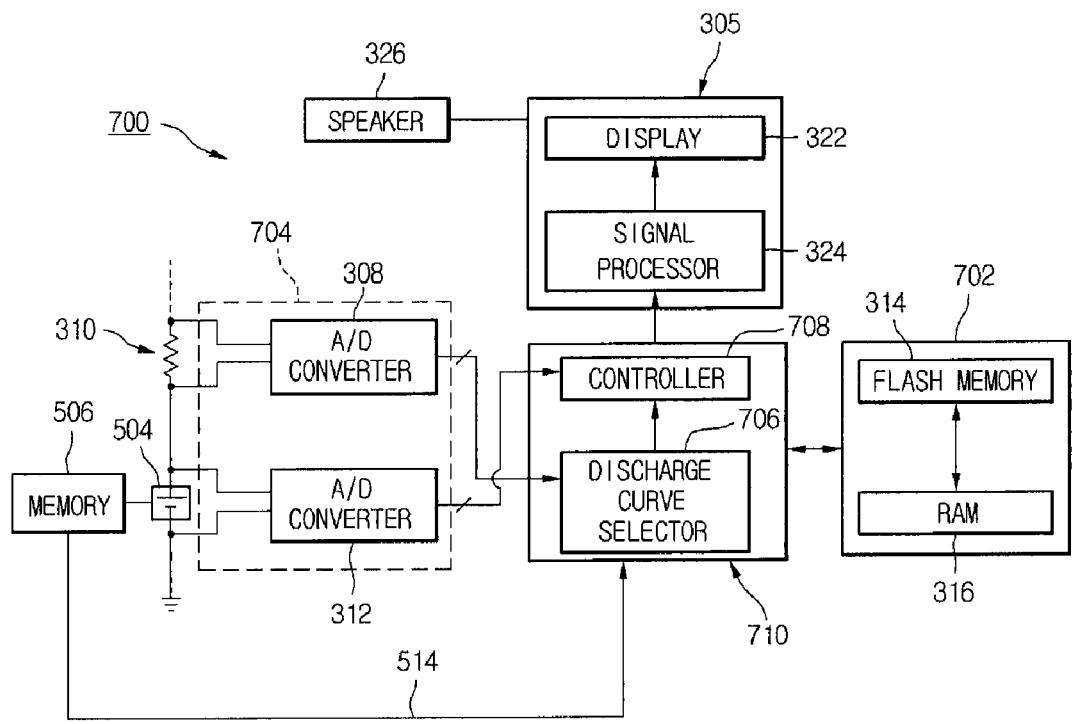
FIG. 7 is a block diagram of another enhanced-accuracy battery capacity prediction system.

FIG. 7 illustrates another exemplary enhanced-accuracy battery capacity prediction apparatus 700 in which multiple discharge curves that vary with respect to a discharge rate, with respect to an electrical current supplied by a rechargeable battery 504 mounted in a mobile electronic device, and/or with respect to a number of charge/discharge cycles of the battery are used to determine a residual capacity of the battery. The apparatus 700 includes a memory module 702 that stores multiple discharge curves that correspond to various predetermined electrical current supply rates and various numbers of charge/discharge cycles of the battery 504, where the battery 504 includes a memory 506. The apparatus 700 also includes a characteristic value detector 704 that detects characteristic values of the battery 504, a discharge curve selector 706 that selects at least one appropriate discharge curve, a controller 708 that determines the residual capacity of the battery 504 and a display unit 305 that displays the determined residual capacity.

As above, the memory module 702 includes a flash memory 314 and a RAM 316. However, the memory module 702 stores discharge curve data representing multiple discharge curves that vary with respect to various predetermined discharge rates of the battery 504 corresponding to various operational states of the mobile electronic device, as well as various numbers of historical charge/discharge cycles of the battery 504.

The discharge curve data includes discharge curves obtained from a series of experiments performed on batteries of a particular type under simulated conditions including a predetermined discharge rate and a predetermined number of charge/discharge cycles. The discharge curve data further includes a discharge characteristic table corresponding to and indexing the discharge curves. Table 1 shows an example of a table indexing discharge curves according to the number of charge/discharge cycles and the discharge rate.

TABLE 1

Multiple Discharge Curves Indexed by Cycles and Discharge Rate

| Cycles | Discharge Rate (mA) | Appropriate Discharge Curve |
|---|---|---|
| 0-100 | 0-340 | 1.1 |
|  | 341-1,700 | 1.2 |
|  | 1,701-3,400 | 1.3 |

TABLE 1-continued

Multiple Discharge Curves Indexed by Cycles and Discharge Rate

| Cycles | Discharge Rate (mA) | Appropriate Discharge Curve |
| --- | --- | --- |
| 101-200 | 0-340 | 2.1 |
|  | 341-1,700 | 2.2 |
|  | 1,701-3,400 | 2.3 |
| 201-300 | 0-340 | 3.1 |
|  | 341-1,700 | 3.2 |
|  | 1,701-3,400 | 3.3 |
| 301-400 | 0-340 | 4.1 |
|  | 341-1,700 | 4.2 |
|  | 1,701-3,400 | 4.3 |
| 401-500 | 0-340 | 5.1 |
|  | 341-1,700 | 5.2 |
|  | 1,701-3,400 | 5.3 |

Table 1 is divided into multiple charge/discharge cycle ranges, each of which is subdivided into multiple discharge rate ranges. In addition, an appropriate discharge curve is designated for each combination of the cycle ranges and rate ranges, although the actual discharge curves are not illustrated.

Table 1 is merely an example, and in other examples the ranges may be divided into any useful range of suitable units of measure. For example, each of the cycle ranges shown in Table 1 may be subdivided into fractions of a discharge rate (C rate), such as 0-0.1 C, 0.11-0.2 C, 0.21-0.3 C, 0.31-0.4 C, 0.41-0.5 C, 0.51-0.6 C, 0.61-0.7 C, 0.71-0.8 C, 0.81-0.9 C and 0.91-1.0 C. Furthermore, the table may be arranged by rate ranges subdivided into cycle ranges. Discharge curves obtained under differing simulated conditions do not affect the application of the enhanced-accuracy battery capacity prediction apparatus 700.

Referring again to FIG. 7, the characteristic value detector 704 includes an A/D converter 308 that detects an electrical current output from the battery 504 and converts the detected current value into a digital data signal. In addition, the characteristic value detector 704 includes another A/D converter 312 that detects a voltage value measured across the terminals of the battery 504 and converts the detected voltage value into a digital data signal.

In this implementation, the battery 504 is configured with an associated memory 506 to store information on the number of charge/discharge cycles of the battery 504 and a counter that increments with each charge/discharge cycle. In addition, the battery 504 provides digital data representing the number of charge/discharge cycles of the battery 504 to the discharge curve selector 706, or the discharge curve selector 706 reads the number of battery cycles from the memory 506 associated with the battery 504 by way of a communication link 514.

Based on the electrical current measured by the A/D converter 308 and on the number of cycles, the discharge curve selector 706 selects an appropriate discharge curve corresponding to the present output characteristic of the battery 504 from the multiple discharge curves in accordance with the current and the battery cycles. For example, the discharge curve selector 706 accesses the discharge characteristic table such as that shown in Table 1 and selects the curve designated for the cycle range and rate range within which the measured battery voltage and received number of battery cycles respectively correspond.

Thus, as a specific example, if the received number of cycles is 250 and the measured discharge rate is 1,800 mA, then curve 3.3 is selected, because curve 3.3 is designated as the appropriate curve in Table 1 for the corresponding cycle and rate ranges, namely, 201-300 cycles and 1,700-3,400 mA.

The controller 708 determines the residual capacity of the battery using the selected discharge curve and the measured battery voltage output by the A/D converter 312. In one implementation the controller 512 may calculate the difference between the discharge capacity corresponding to the minimum acceptable voltage and the discharge capacity corresponding to the measured battery voltage based on the selected curve.

Referring again to FIG. 6, if the selected curve 3.3 corresponds to the lowermost curve 604 and the battery voltage detected by A/D converter 312 is approximately 3.7V, then the detected battery voltage corresponds to a point 606 on the curve 604. The point 606 further corresponds to a present battery discharge capacity of approximately 800 mAh. Under the assumption that the minimum acceptable voltage level of the battery is 3.0V, the minimum level corresponds to another point 608 on the curve 604, which further corresponds to a useful battery discharge capacity of approximately 1,180 mAh. The present residual capacity of the battery 504 is calculated by subtracting the present battery discharge capacity from the useful battery discharge capacity: 1,180-800=380 mAh.

If at a later time the battery voltage detected by A/D converter 312 is approximately 3.1 V, then the detected battery voltage corresponds to a point 610 on the curve 604. The point 610 further corresponds to a present battery discharge capacity of approximately 1,140 mAh. The present residual capacity of the battery 504 corresponding to the later time is calculated by subtracting the present battery discharge capacity from the useful battery discharge capacity: 1,180-1,140=40 mAh.

The display unit 305 then displays the determined residual capacity or a percentage residual capacity. As above, the display unit 305 includes a display device 322 and a signal processor 324. Furthermore, the apparatus 300 may optionally include a speaker 326. Thus, for example, in the latter example above with a battery residual capacity of 40 mAh, the controller 708 may be configured to output a warning signal indicating that the battery 504 is nearly fully drained to the speaker 326 to generate an audio warning sound.

In alternative implementations of the enhanced-accuracy battery capacity prediction apparatus 700, the number of charge/discharge cycles of the battery is not stored in the associated memory 506 of the battery 504. For example, the mounted battery 504 may not include an associated memory 506, or the associated memory 506 or the counter may malfunction. In such an implementation, the communication link 514 is omitted. As a result, the discharge curve selector 706 cannot use the actual number of cycles to select an appropriate curve.

In this case, the discharge curve selector 706 selects an appropriate discharge curve based on an estimate of the number of charge/discharge cycles. In some implementations, the user may manually enter an estimate of the number of cycles. In other implementations, the discharge curve selector 706 or the controller 708 may estimate the number of historical battery charge/discharge cycles for use by the discharge curve selector 706. For example, in one particular implementation, the controller 708 reads a manufacturing date of the battery and generates an estimate of the number of cycles based on the manufacturing date.

In another implementation, the discharge curve selector 706 or the controller 708 determines an estimated number of cycles based on two or more readings of a characteristic value of the battery taken at different times. For example, the characteristic value detector 704 may measure an initial battery voltage, store the measurement in memory, monitor the battery output, for example, discharge rate, over a period of time and store the monitored output in memory, and then measure a final battery voltage and store the measured final voltage in memory. The discharge curve selector 706 or the controller 708 reads the initial voltage, the output and the final voltage from memory and compares these to the various discharge curves that are stored in memory and identifies a curve that coincides with or is a close match to the initial voltage, the output and the final voltage. The number of cycles associated with the matching curve is used as an estimate of the number of charge/discharge cycles of the battery.

In another alternative implementation of the enhanced-accuracy battery capacity prediction apparatus 700, multiple discharge curves that vary with respect to the discharge rate as well as multiple discharge curves that vary with respect to a number of charge/discharge cycles of the battery are used to determine a residual capacity of the battery. Based on the detected electrical current and on the received number of cycles, the discharge curve selector 706 selects one appropriate curve based on the discharge rate and a second appropriate curve based on the number of cycles. The controller 708 combines the two selected curves to create a combined battery discharge curve that is based on the discharge rate and on the number of cycles. The controller 708 determines the residual capacity of the battery using the combined curve and the measured battery voltage output.

Figure 8:
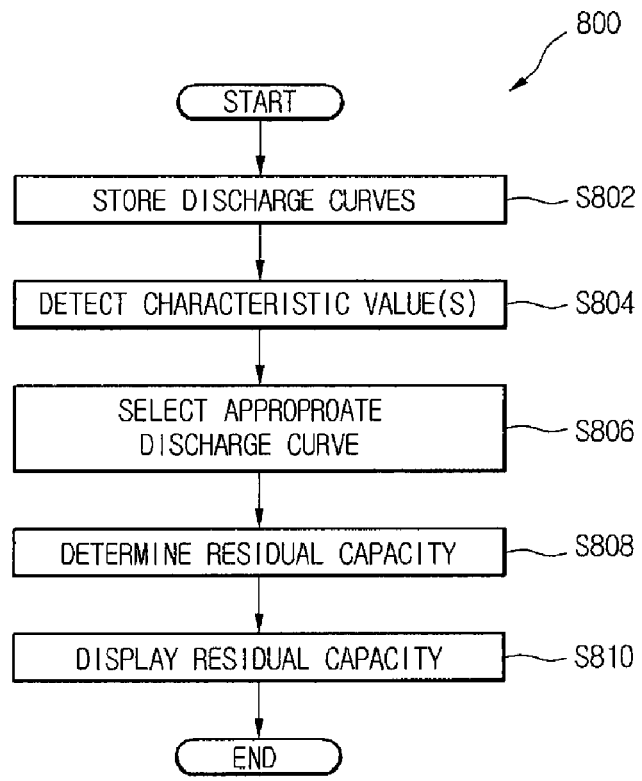
FIG. 8 is a flowchart of a process for determining and displaying an enhanced-accuracy battery capacity prediction.

FIG. 8 is a flowchart showing an example of a method 800 of determining and displaying an enhanced-accuracy battery capacity prediction. When method 800 begins, multiple discharge curves are stored in a memory module (S802). For example, when a mobile electronic device is activated, a controller loads multiple discharge curves from a flash memory into a RAM. In another implementation, the curves are downloaded from an external server into RAM, for example, by way of a cable or wireless connection to a communication network, such as the Internet or a public telecommunication network. In yet another implementation, the discharge curves are read from a memory associated with the battery and stored in RAM. Furthermore, the curves may be based on battery voltage, on battery voltage and a discharge rate of the battery, on battery voltage and a number of historical charge/discharge cycles of the battery, or on battery voltage, a discharge rate of the battery and a number of historical charge/discharge cycles of the battery.

For example, when performing a particular operation, or during a particular operational state, a mobile electronic device receives power from a battery mounted to the device. The amount of power supplied from the battery varies depending on the operation or state. For example, the discharge rate of the battery may vary according to an operation being performed by the device, such as according to an input command of a user under control of a controller of the device. As a result, the residual capacity of the battery varies over time depending on the operation or state of the mobile electronic device.

In order to determine the residual capacity of the battery in relation to such variable characteristics, one or more characteristic values of the battery are detected during a predetermined operation or state (S804). For example, the battery voltage is measured, the discharge rate is measured, and/or the number of historical charge/discharge cycles is read or received.

Figure 9:
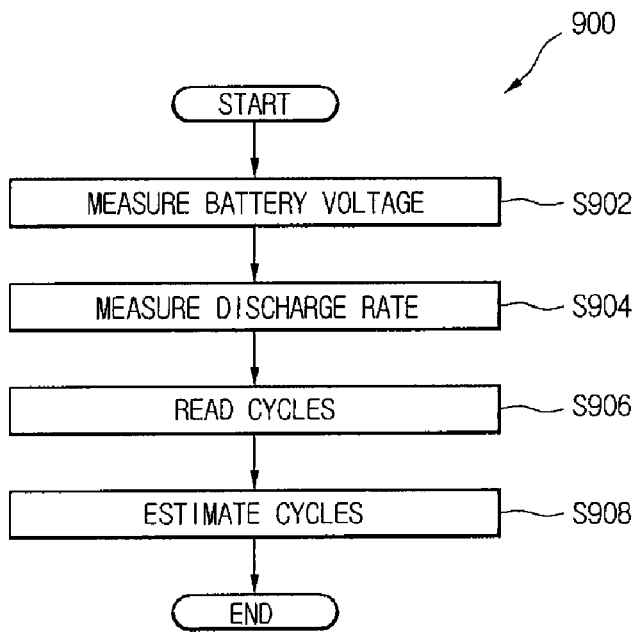
FIG. 9 is a flowchart of a process for detecting characteristic values of a battery.

In detecting the characteristic values (S804), as shown in FIG. 9, the battery voltage is measured (S902), the discharge rate is measured (S904), and the number of charge/discharge cycles is read or received (S906). Furthermore, if the actual number of battery cycles is not available, the number of charge/discharge cycles is estimated (S908), such as, for example, based on a user input or on two or more characteristic value readings taken over a period of time. In alternate implementations, the discharge rate may not be measured (S904), the number of charge/discharge cycles may not be read or received (S906), or the number of charge/discharge cycles may not be estimated (S908).

An appropriate discharge curve is selected from among the stored discharge curves (S806) in accordance with one or more of the characteristic values. The curve may be selected based on the measured discharge rate, based on the read or received number of historical charge/discharge cycles, or based on both the measured discharge rate and the read or received number of cycles.

Figure 10:
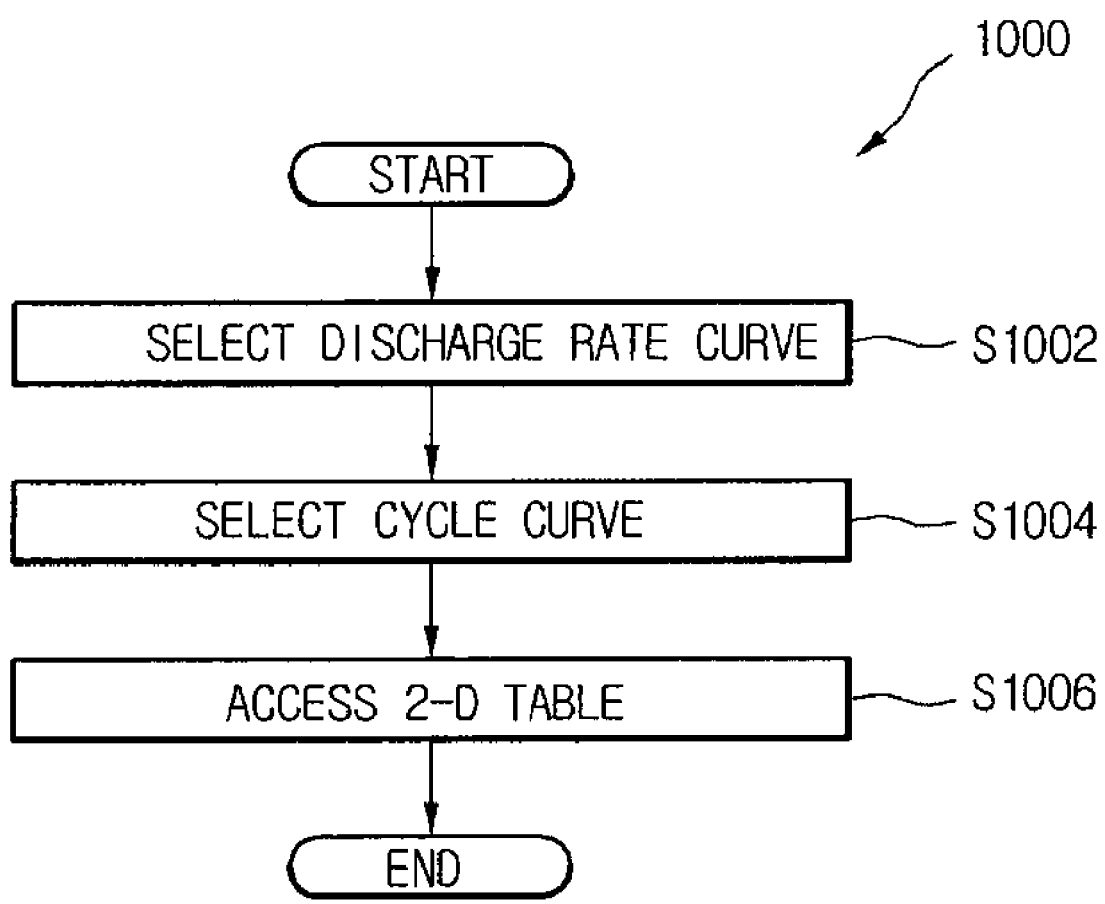
FIG. 10 is a flowchart of a process for selecting an appropriate battery discharge curve.

Thus, in selecting an appropriate discharge curve, as shown in FIG. 10, a curve may be selected (S1002) based on the measured discharge rate supplied by the battery, and a curve may be selected (S1004) based on the read or received number of historical charge/discharge cycles. Furthermore, a two-dimensional table may be accessed (S1006) in order to identify a designated curve based on both the measured discharge rate and on the read or received number of cycles, as explained above. In alternate implementations, the curve may not be selected based on the measured discharge rate supplied by the battery (S1002), the curve may not be selected based on the read or received number of historical charge/discharge cycles (S1004), or the two-dimensional table may not be accessed (S1006).

A residual capacity of the battery is determined based on the selected curve (S808). For example, given the present operational state, a remaining power capacity of the battery corresponding to the measured voltage value is calculated based on the selected curve by comparing or subtracting the capacity corresponding to the measured voltage value from the curve with the maximum capacity of the curve. The determined residual capacity or a percentage residual capacity of the battery is then displayed (S810), for example, on a display unit for viewing by a user.

In this manner, the accurate residual capacity of the battery is displayed to a user. Therefore, the user can be notified of the accurate remaining capacity of the battery available to continue the present operation of the associated device. That is, the battery residual capacity is displayed based on the current rate at which electrical current is being discharged from the battery, in accordance with an operational state of the associated device.

In the above implementations of the enhanced-accuracy battery capacity prediction apparatus and method, the discharge curve data represents multiple discharge curves. Nevertheless, in alternative implementations, the discharge curve data may represent multiple discharge curve equations. For example, in one particular implementation, a single equation may represent a discharge curve, while in another implementation, a set of equations may represent a discharge curve. Furthermore, the discharge curve data may represent one or more tables stored in a digital data format mapping predetermined voltage values to predetermined battery discharge capacity values, for example, based on the discharge curves. The discharge curve data may also represent one or more tables stored in a digital data format correlating varying numbers of charge/discharge cycles and varying discharge rates to multiple discharge curves or equations. Thus, in general, the discharge curve data can include discharge curves, discharge curve equations and tables related to the discharge curves.

In addition, in alternative implementations of the enhanced-accuracy battery capacity prediction apparatus and method, an audio or visual warning signal is provided to the user when the battery residual capacity approaches a minimum acceptable level. For example, the display screen may flicker, the displayed residual capacity may flash, or a sound may be generated by the speaker.

Furthermore, in an alternative implementation of the enhanced-accuracy battery capacity prediction apparatus and method, the battery is not mounted on the device. Similarly, in another alternative implementation the battery is not rechargeable. Moreover, in implementations that include a memory associated with the battery, the discharge curve data may be stored in the associated memory of the battery and downloaded to RAM when the associated electrical device is activated. In other implementations that include a memory associated with the battery, the associated electrical device does not include nonvolatile memory, such as flash memory.

It is understood that various modifications may be made without departing from the spirit and scope of the claims. For example, advantageous results still could be achieved if steps of the disclosed techniques were performed in a different order and/or if components in the disclosed systems were combined in a different manner and/or replaced or supplemented by other components.

The arrangements have been described with particular illustrative implementations. It is to be understood that the concepts and implementations are not however limited to the above-described implementations and that various changes and modifications may be made.

What is claimed is:

1. A method comprising:
   detecting a voltage across a battery, an electrical current supplied by the battery, and a number of charge/discharge cycles of the battery;
   selecting a first curve from a plurality of battery discharge curves based at least in part on the electrical current supplied by the battery;
   selecting a second curve from the plurality of battery discharge curves based at least in part on the number of charge/discharge cycles;
   generating a combined curve based at least in part on the first and second curves;
   determining a residual battery capacity based at least in part on the measured voltage and the combined curve; and
   displaying the residual battery capacity.

2. The method of claim 1, further comprising storing the plurality of battery discharge curves based at least in part on a discharge characteristic of the battery.

3. A method comprising:
   measuring a voltage across a battery;
   detecting a first characteristic value of the battery, wherein the first characteristic value comprises a number of charge/discharge cycles;
   selecting a curve from a plurality of battery discharge curves based at least in part on the first characteristic value; and
   determining a residual battery capacity based at least in part on the measured voltage and the selected curve.

4. The method of claim 3, wherein each of the battery discharge curves is associated with a range of characteristic values.

5. The method of claim 3, further comprising:
   generating a first digital data signal based on the measured voltage; and
   generating a second digital data signal based on a second characteristic value, wherein the second characteristic value comprises an electrical current supplied by the battery,
   wherein the selection of the curve is further based at least in part on the second characteristic value.

6. The method of claim 3, wherein detecting the first characteristic value further comprises receiving a digital data signal indicative of the number of charge/discharge cycles from a memory associated with the battery.

7. The method of claim 3, wherein detecting the first characteristic value further comprises receiving a user input indicative of the number of charge/discharge cycles.

8. The method of claim 3, wherein detecting the first characteristic value further comprises estimating the number of charge/discharge cycles.

9. The method of claim 8, wherein the estimate is based at least in part on a manufacturing date of the battery.

10. The method of claim 8, wherein estimating the number of charge/discharge cycles further comprises:
    measuring an initial voltage across the battery at a first time;
    monitoring an output of the battery between the first time and a second time;
    measuring a final voltage across the battery at the second time;
    mapping the initial voltage, the output and the final voltage to a matching curve from the plurality of battery discharge curves; and
    establishing the number of charge/discharge cycles based at least in part on the matching curve.

11. The method of claim 3, further comprising detecting a second characteristic value of the battery, the second characteristic value comprising an electrical current supplied by the battery, wherein the selection of the curve is further based at least in part on the second characteristic value.

12. The method of claim 11, wherein the selection of the curve further comprises accessing a two-dimensional table indexed by the first characteristic value and the second characteristic value.

13. The method of claim 3, further comprising storing the battery discharge curves in a memory, wherein the battery discharge curves are predetermined based at least in part on a discharge characteristic of the battery.

14. The method of claim 13, wherein the memory is associated with the battery.

15. The method of claim 13, further comprising downloading the battery discharge curves from a data server.

16. The method of claim 3, further comprising displaying the residual battery capacity.

17. A device comprising:
    a battery;
    a memory configured to store a plurality of battery discharge curves based at least in part on a discharge characteristic of the battery;
    a battery characteristic value detector configured to measure a voltage across the battery and a characteristic value of the battery, wherein the characteristic value comprises a number of charge/discharge cycles of the battery;
    a battery discharge curve selector configured to select a curve from the plurality of battery discharge curves based at least in part on the measured characteristic value;
    a controller configured to determine a residual battery capacity based at least in part on the measured voltage and the selected curve; and a display configured to display the residual battery capacity.

18. A device comprising:

a battery;

a memory configured to store a plurality of battery discharge curves based at least in part on a discharge characteristic of the battery;

a battery characteristic value detector configured to measure a voltage across the battery, an electrical current supplied by the battery, and a number of charge/discharge cycles;

a battery discharge curve selector configured to select a first curve from the plurality of battery discharge curves based at least in part on the electrical current supplied by the battery, and a second curve from the plurality of battery discharge curves based at least in part on the number of charge/discharge cycles;

a controller configured to generate a combined curve based at least in part on the first and second curves, and to determine a residual battery capacity based at least in part on the measured voltage and the combined curve; and a display configured to display the residual battery capacity.

19. A device comprising:

a battery;

a battery characteristic value detector configured to measure a voltage across the battery;

a battery discharge curve selector configured to select a curve from a plurality of battery discharge curves; and a controller configured to determine a residual battery capacity based at least in part on the measured voltage and the selected curve, wherein the battery discharge curve selector further comprises a reader configured to receive a number of charge/discharge cycles of the battery and is further configured to select the curve based at least in part on the number of charge/discharge cycles.

20. The device of claim 19, wherein the battery characteristic value detector is further configured to measure an electrical current supplied by the battery, and the battery discharge curve selector is further configured to select the curve based at least in part on the measured electrical current.

21. A device comprising:

a battery, a battery characteristic value detector configured to measure a voltage across the battery;

an estimator configured to estimate a number of charge/discharge cycles of the battery;

a battery discharge curve selector configured to select a curve from a plurality of battery discharge curves based at least in part on the number of charge/discharge cycles; and a controller configured to determine a residual battery capacity based at least in part on the measured voltage and the selected curve.

* * * * *